(12) United States Patent
Chuang

(10) Patent No.: US 7,915,072 B1
(45) Date of Patent: Mar. 29, 2011

(54) NON-VACUUM COATING METHOD FOR PREPARING LIGHT ABSORBING LAYER OF SOLAR CELL

(75) Inventor: Chuan-Lung Chuang, Taoyuan (TW)

(73) Assignee: Jenn Feng New Energy Co., Ltd., Taoyuan (TW)

( * ) Notice: Subject to any disclaimer, the term of this patent is extended or adjusted under 35 U.S.C. 154(b) by 0 days.

(21) Appl. No.: 12/621,515

(22) Filed: Nov. 19, 2009

(51) Int. Cl.
*H01L 21/00* (2006.01)

(52) U.S. Cl. ............... 438/95; 438/72; 438/82; 438/85; 438/93; 438/98; 257/E21.002

(58) Field of Classification Search .......... None
See application file for complete search history.

(56) References Cited

U.S. PATENT DOCUMENTS

| 6,258,620 B1 * | 7/2001 | Morel et al. ............... 438/57 |
| 2005/0074915 A1 * | 4/2005 | Tuttle et al. ............... 438/57 |

* cited by examiner

*Primary Examiner* — N Drew Richards
*Assistant Examiner* — Kyoung Lee

(57) ABSTRACT

A coating method for preparing a light absorbing layer of a solar cell is provided. In a non-vacuum environment, an ultrasonic vibrating mixer is employed to mix a CIGS mixture with a mixing fluid to obtain a CIGS coating material. The CIGS coating material is then uniformly coated on a molybdenum (Mo) layer which is driven by a conveyor device, so as to form a CIGS coating material layer having a uniform thickness on the Mo layer. An infrared ray (IR) heating lamp is then used to dry the CIGS coating material layer for removing residue of the mixing fluid remained in the CIGS coating material layer. In such a way, a CIGS light absorbing layer adapted for absorbing a solar energy and converting the absorbed solar energy into an electric energy is obtained. The CIGS light absorbing layer can be then used for fabricating a CIGS solar cell.

8 Claims, 3 Drawing Sheets

NON-VACUUM COATING METHOD FOR PREPARING LIGHT ABSORBING LAYER OF SOLAR CELL

BACKGROUND OF THE INVENTION

1. Field of the Invention

The present invention relates generally to a coating method for preparing a light absorbing layer of a solar cell, and more particularly, to a coating method adapted for being executed in a non-vacuum environment.

2. The Prior Arts

Typically, solar cells can be categorized into monocrystal silicon solar cell, polysilicon solar cell, amorphous silicon solar cell, dye-sensitized solar cell, and copper/indium/gallium/selenium (CIGS) solar cell, and so on. Comparing with the silicon solar cell which relies on the supply of silicon wafers, and the dye-sensitized solar cell which employs specific and expensive sensitizing dye, a CIGS solar cell is featured with outstanding advantages. For example, the CIGS solar cell is made of copper, indium, gallium, selenium which are much cheaper than the raw materials of the silicon wafers, as well as the sensitizing dye. Further, the CIGS solar cell can achieve a photoelectric conversion efficiency, up to 20% to 30%, and even a CIGS solar cell formed on a flexible plastic substrate can also achieve a photoelectric conversion efficiency, up to 14%. As such, CIGS solar cells are believed a very promising kind for further development.

A typical CIGS solar cell mainly includes a $Cu(InGa)Se_2$ layer, and a ZnS layer, serving as a P type layer and an N type layer, respectively. A P-N junction is formed at an interface between the $Cu(InGa)Se_2$ layer and the ZnS layer. The $Cu(InGa)Se_2$ layer is coated on a molybdenum layer which serves as a back electrode, and the molybdenum layer is formed on a glass substrate.

Currently, a series of vacuum processing procedures developed by Shell Solar Inc. (SSI) are mainly commercially used for fabricating CIGS solar cells. However, such vacuum processing procedures must be performed with very expensive vacuum equipment, which is complicated and difficult to maintain.

Another conventional technology proposes to execute a coevaporation process or a selenization process for configuring the $Cu(InGa)Se_2$ layer. According to a coevaporation process, individual evaporation sources, e.g., Cu, In, Ga, Se targets, respectively, are heated to evaporate at the same time, so as to form a $Cu(InGa)Se_2$ layer on the molybdenum layer. Specifically, the Cu target is heated to a temperature of 1300° C. to 1400° C., the In target is heated to a temperature of 1000° C. to 1100° C., the Ga target is heated to a temperature of 1150° C. to 1250° C., and the Se target is heated to a temperature of 3000° C. to 3500° C. However, such a coevaporation process is hard to control. Specifically, the evaporation amount of the Cu target is not easy to precisely control.

As to the selenization process, it employs two step processing, in which Cu, In, and Ga are sputtered to deposit on a substrate to form a precursor film, and then selenium hydride is added thereto to react with the precursor film, thus obtaining the $Cu(InGa)Se_2$ layer. However, the selenization process has a low freedom of controlling the ingredients, and is hard to vary the energy gap thereof, and the produced $Cu(InGa)Se_2$ layer film is featured with a poor bondability to the substrate. Accordingly, both of the coevaporation process and the selenization process are remained at a laboratory phase, and not yet be commercially developed.

Accordingly, a method for preparing a $Cu(InGa)Se_2$ layer having a high reliability and an improved photoelectric conversion efficiency under an atmospheric pressure is highly demanded.

SUMMARY OF THE INVENTION

A primary objective of the present invention is to provide a coating method for preparing a light absorbing layer of a solar cell. According to the present invention, in a non-vacuum environment, an ultrasonic vibrating mixer is employed to mix copper (Cu), indium (In), gallium (Ga), selenium (Se) ingredients with a mixing fluid to obtain a Cu/In/Ga/Se coating material. The Cu/In/Ga/Se coating material is then uniformly coated on a molybdenum (Mo) layer which is driven by a conveyor device, so as to form a Cu/In/Ga/Se coating material layer having a uniform thickness on the Mo layer. An infrared ray (IR) heating lamp is then used to dry the Cu/In/Ga/Se coating material layer for removing residue of the mixing fluid remained in the Cu/In/Ga/Se coating material layer. In such a way, a CIGS light absorbing layer adapted for absorbing a solar energy and converting the absorbed solar energy into an electric energy is obtained. The CIGS light absorbing layer can be then used for fabricating a CIGS solar cell.

The coating method of the present invention does not require to be executed in a vacuum environment, and is thus adapted for extremely saving the production cost. Therefore, it can be used for continuously fabricating CIGS solar cells under an atmospheric pressure, so as to improve the reliability and stability of the products.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
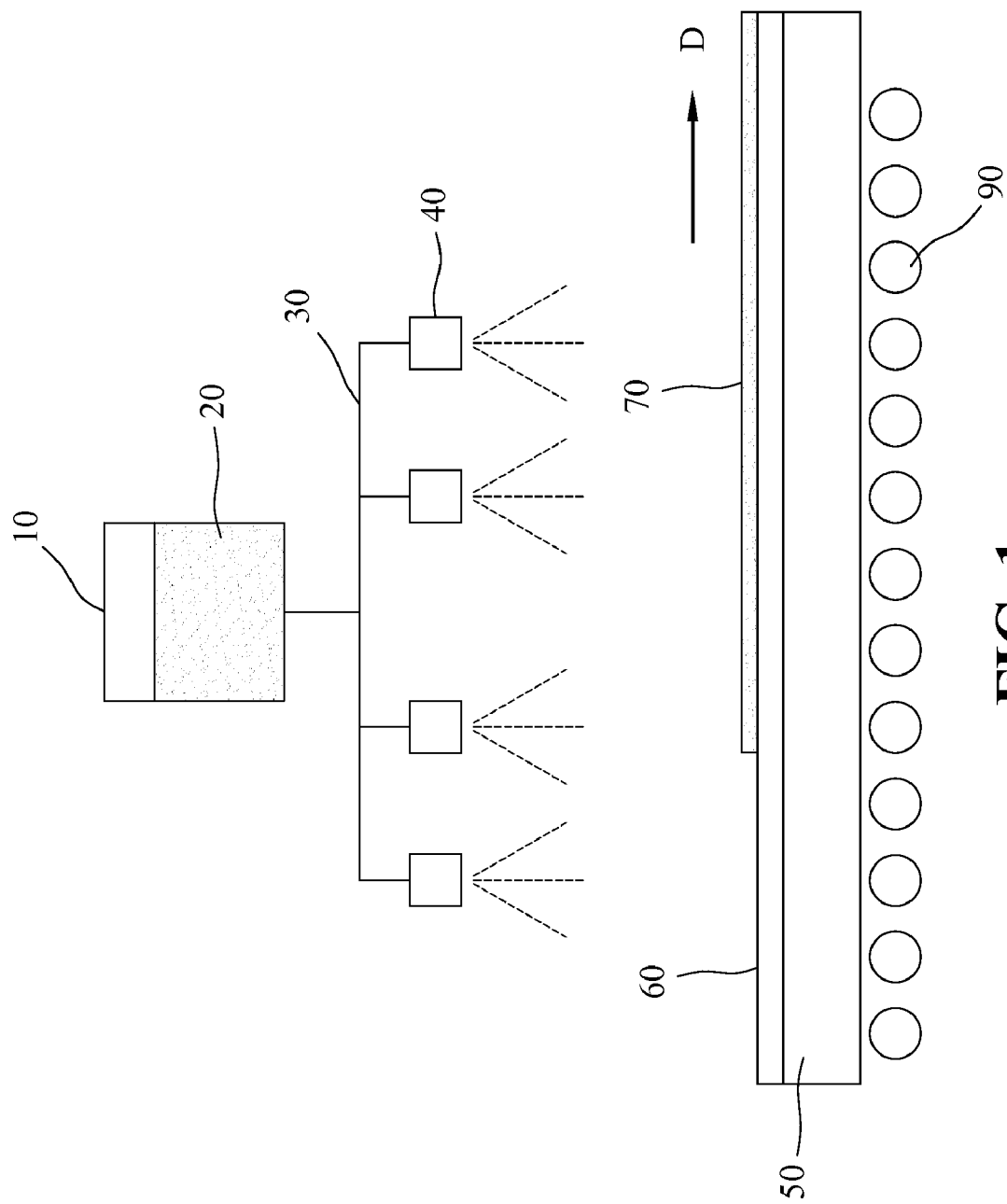
FIG. 1 is a schematic diagram illustrating a coating method for preparing a light absorbing layer of a solar cell according to an embodiment of the present invention.

FIG. 1 is a schematic diagram illustrating a coating method for preparing a light absorbing layer of a solar cell according to an embodiment of the present invention. The coating method according to the present invention includes two steps, i.e., a coating process, and a drying process, for preparing a CIGS layer on a Mo layer formed on a glass substrate.

Referring to FIG. 1, the coating method is executed in a non-vacuum environment under an atmospheric pressure. First, an ultrasonic vibrating mixer 10 is used to mix a CIGS mixture including copper (Cu), indium (In), gallium (Ga), selenium (Se) ingredients with a mixing fluid to obtain a Cu/In/Ga/Se coating material 20. The CIGS mixture includes Cu(InGa)Se$_2$ configured in a powder form or a particle form. The mixing fluid can be pure water, deionized water, alcohol, or acetone.

The Cu/In/Ga/Se coating material 20 is then distributed by a distributing pipeline 30 to a plurality of ultrasonic nozzles 40. A glass substrate 50 having a molybdenum (Mo) layer 60 configured thereon is positioned under the ultrasonic nozzles 40. The Mo layer 60 is deposited on a surface of the glass substrate 50 facing the ultrasonic nozzles 40. The glass substrate is driven by a conveyor device 90 to move toward a direction D as shown in FIG. 1. The ultrasonic nozzles 40 are spacedly arranged in alignment with the Mo layer 60 on the glass substrate 50. An ultrasonic vibration is applied for multiple coating the Cu/In/Ga/Se coating material 20 onto the Mo layer 60. An amount of the Cu/In/Ga/Se coating material 20 sprayed by each of the ultrasonic nozzles 40 is controlled by a spraying control unit (not shown in the drawings). In such a way, a Cu/In/Ga/Se coating material layer 70 having a uniform thickness is uniformly configured on the Mo layer.

Figure 2:
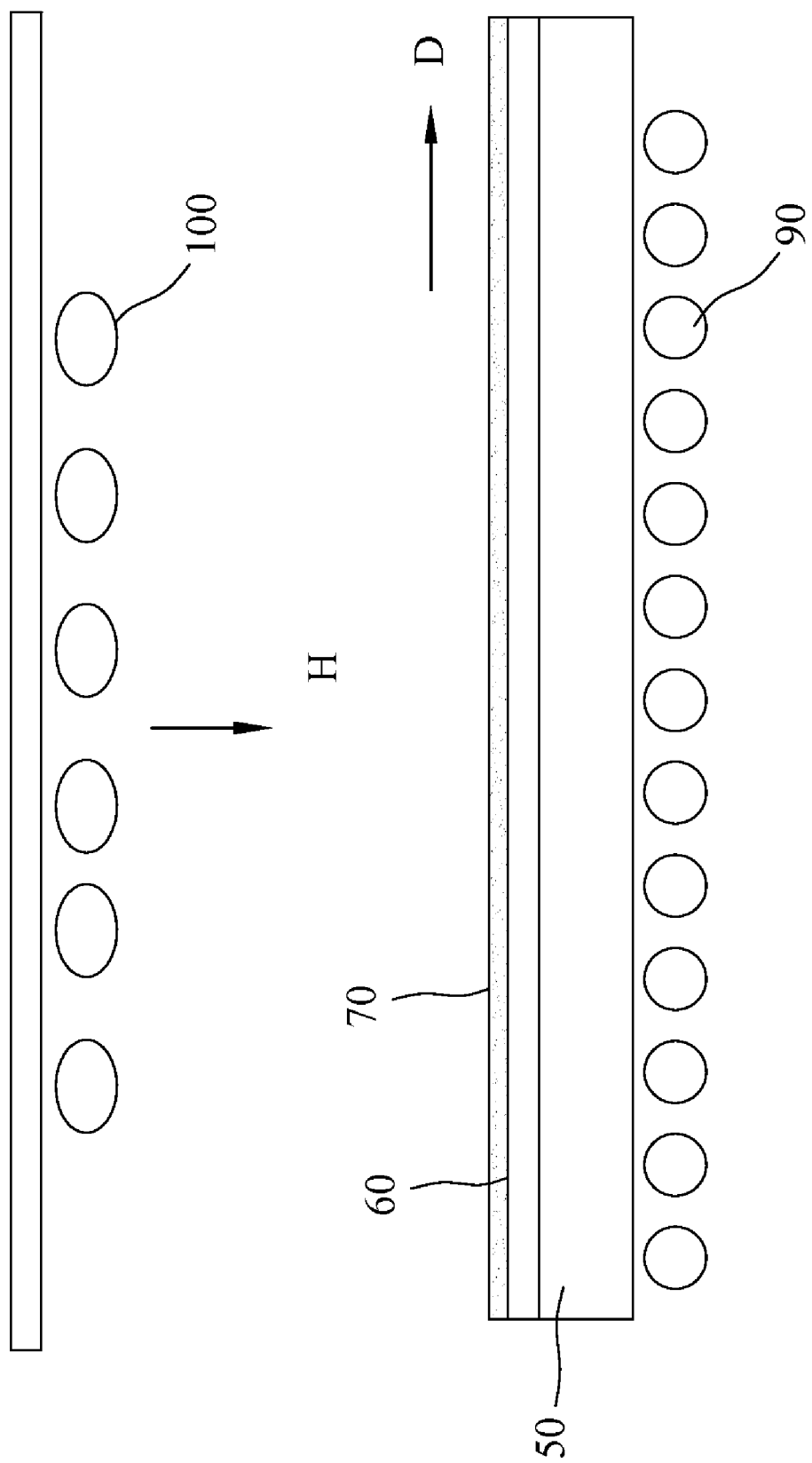
FIG. 2 is a schematic diagram illustrating a drying process of the coating method according to an embodiment of the present invention.

FIG. 2 is a schematic diagram illustrating a drying process of the coating method according to an embodiment of the present invention. Referring to FIG. 2, there is shown a plurality of infrared ray (IR) heating lamps 100 are used to generate IR radiation illuminating toward a direction H as shown in FIG. 2 for drying the Cu/In/Ga/Se coating material layer 70 for removing residue of the mixing fluid remained in the Cu/In/Ga/Se coating material layer. In such a way, a CIGS light absorbing layer adapted for absorbing a solar energy and converting the absorbed solar energy into an electric energy is obtained. The CIGS light absorbing layer can be then used for fabricating a CIGS solar cell. The IR heating lamps 100 are arranged in alignment with the Cu/In/Ga/Se coating material layer 70. The Cu/In/Ga/Se coating material layer 70 has a thickness within the range of 1.5 to 5 µm.

Figure 3:
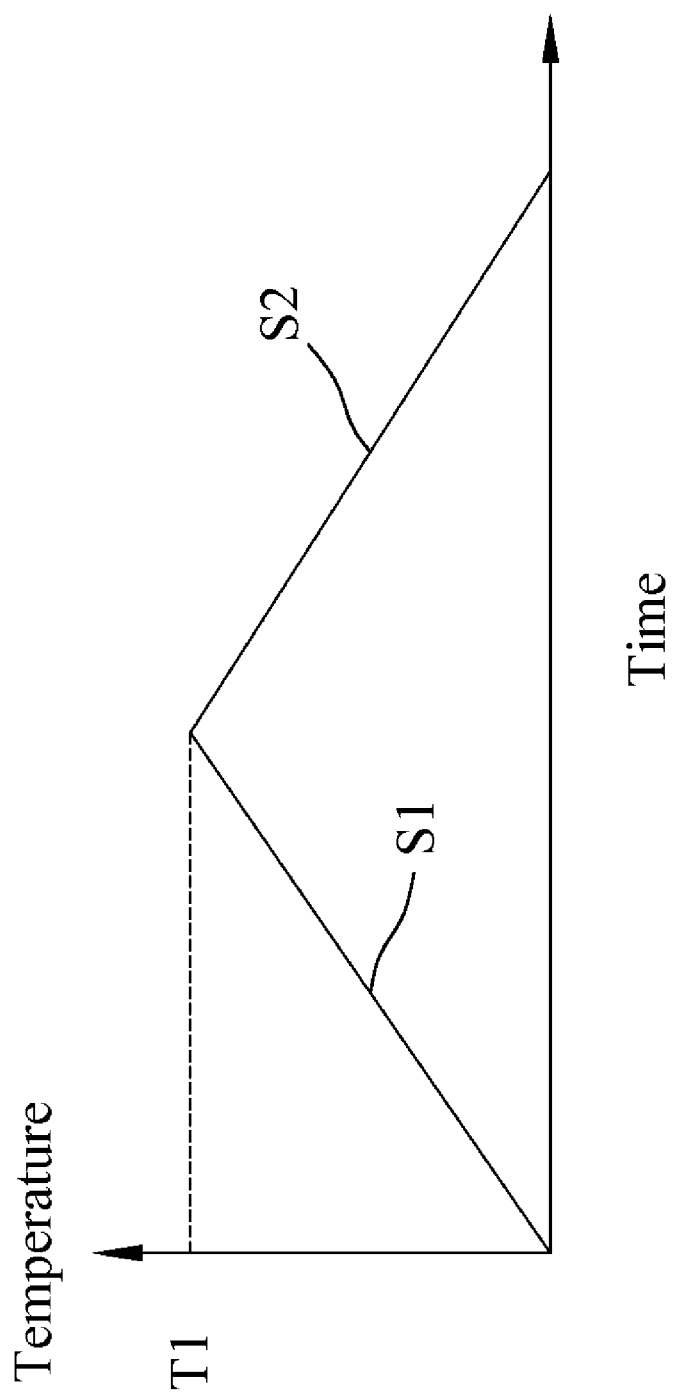
FIG. 3 is a graph showing a temperature curve controlled during the drying process of the coating method according to an embodiment of the present invention.

FIG. 3 is a graph showing a temperature curve controlled during the drying process of the coating method according to an embodiment of the present invention. Referring to FIG. 3, the drying process includes a heating process and a cooling process, which can be referred in accordance with the heating temperature curve S1 and the cooling temperature curve S2, respectively. A heating rate of the heating temperature curve S1 is within the range of 2 to 10° C./minute, and a cooling rate of the cooling temperature curve S2 is within the range of 2 to 10° C./minute. A maximum heating temperature T1 as shown in FIG. 3 is within the range of 30 to 250° C.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A non-vacuum coating method for forming a copper/indium/gallium/selenium (CIGS) layer on a molybdenum layer deposited on a glass substrate in a non-vacuum environment under an atmospheric pressure, wherein the glass substrate together with the Mo layer deposited thereon is driven to move by a conveyor device, the non-vacuum coating method comprising:

utilizing an ultrasonic vibrating mixer to mix a CIGS mixture with a mixing fluid to obtain a uniform CIGS coating material;

distributing the CIGS coating material via a delivering pipeline to a plurality of ultrasonic nozzles, wherein the ultrasonic nozzles are positioned over the Mo layer;

applying an ultrasonic vibration for spraying the CIGS coating material onto the Mo layer, and forming a CIGS coating material layer; and utilizing a plurality of infrared ray (IR) heating lamps for generating an IR radiation to conduct a drying process to the formed CIGS layer for removing residue of the mixing fluid remained in the CIGS coating material layer, thus obtaining the CIGS layer, wherein the CIGS layer is adapted for serving as a light absorbing layer of a solar cell.

2. The non-vacuum coating method according to claim 1, wherein the CIGS mixture comprises Cu(InGa)Se$_2$ powders or Cu(InGa)Se$_2$ particles.

3. The non-vacuum coating method according to claim 1, wherein the mixing fluid is selected from a group consisting of pure water, deionized water, alcohol, and acetone.

4. The non-vacuum coating method according to claim 1, further comprising a spraying control unit for controlling an amount of the CIGS coating material sprayed by each of the ultrasonic nozzles.

5. The non-vacuum coating method according to claim 1, wherein the ultrasonic nozzles are spacedly arranged in alignment with the Mo layer on the glass substrate.

6. The non-vacuum coating method according to claim 1, wherein the IR heating lamps are spacedly arranged in alignment with the CIGS coating material layer.

7. The non-vacuum coating method according to claim 1, wherein the CIGS coating material layer has a thickness within the range of 1.5 to 5 µm.

8. The non-vacuum coating method according to claim 1, wherein the drying process comprises a heating process and a cooling process, wherein a heating rate of the heating process is within the range of 2 to 10° C./minute, a cooling rate of the cooling process is within the range of 2 to 10° C./minute, and a maximum heating temperature of the drying process is within the range of 30 to 250° C.

* * * * *